United States Patent [19]

Baker

[11] 4,366,522
[45] Dec. 28, 1982

[54] SELF-SNUBBING BIPOLAR/FIELD EFFECT (BIOFET) SWITCHING CIRCUITS AND METHOD

[75] Inventor: Richard H. Baker, Bedford, Mass.

[73] Assignee: Reliance Electric Company, Cleveland, Ohio

[21] Appl. No.: 146,200

[22] Filed: May 2, 1980

Related U.S. Application Data

[63] Continuation-in-part of Ser. No. 101,465, Dec. 10, 1979, abandoned.

[51] Int. Cl.³ .............................................. H02H 7/20
[52] U.S. Cl. ......................................... 361/91; 361/8; 361/56; 307/253; 323/272; 323/289; 363/55
[58] Field of Search ..................... 361/8, 13, 54, 3, 5, 361/6, 58, 7, 9, 10, 111, 11, 91, 56; 307/134, 571, 135, 137, 253, 254, 255, 264, 268, 288, 313, 200 A; 363/55, 56; 323/272, 901, 276, 289; 330/298, 207 P

[56] References Cited

U.S. PATENT DOCUMENTS

| | | | |
|---|---|---|---|
| 3,307,044 | 2/1967 | Furukawa et al. | 307/246 |
| 3,402,302 | 9/1968 | Coburn | 361/8 X |
| 3,532,903 | 10/1970 | Roth | 307/253 |
| 3,705,333 | 12/1972 | Galetto et al. | 361/159 |
| 3,729,655 | 4/1973 | Gratzke | 361/8 |
| 4,010,387 | 3/1977 | Akamatsu | 307/253 |
| 4,013,904 | 3/1977 | Chick | 361/91 X |
| 4,042,836 | 8/1977 | Compton et al. | 307/255 X |
| 4,274,014 | 6/1981 | Schade, Jr. | 307/279 X |

Primary Examiner—Patrick R. Salce
Attorney, Agent, or Firm—Allan M. Lowe; Kenneth Watov; Ronald R. Stanley

[57] ABSTRACT

A high-power, solid-state switching circuit includes in a preferred embodiment a first switching device susceptible to damage from excessive peak power dissipation at times of turn-on and turn-off in switching high currents from a relatively high-voltage supply, the first switching device having its main current path connected in parallel with the main current path of a second switching device that is substantially less susceptible to such damage from excessive peak power dissipation, but which has a substantially higher impedance in its main current path than the first device when turned on, the devices complementing one another via the operation of said switching circuit for turning on the second device before the first device, thereby substantially lowering the voltage across the main current path of the first device, allowing the latter to be turned on and turned off with substantially reduced peak power dissipation via the snubbing effect of the second device, and the first device relative to the second device providing substantially reduced power dissipation during the on-state of the switching circuit.

65 Claims, 13 Drawing Figures

_Fig. 11_

_Fig. 12_   _Fig. 13_

SELF-SNUBBING BIPOLAR/FIELD EFFECT (BIOFET) SWITCHING CIRCUITS AND METHOD

CROSS-REFERENCE TO RELATED APPLICATIONS

This application is a continuation-in-part of U.S. application Ser. No. 101,465, filed Dec. 10, 1979, now abandoned.

The field of the present invention relates generally to solid-state devices and circuits for switching high-magnitudes of current at high levels of voltage and, more particularly relates to active snubber devices and circuits for snubbing power semiconductor switches.

In general, all high performance power semiconductors, when used in applications for switching relatively high levels of power, require snubbing. For example, to turn off a silicon controlled rectifier switch (SCR), the current flowing through it must be reduced to zero for a given period of time commonly known as the commutation time. Also, during turning on or turning off an SCR, the change in voltage with respect to time (dv/dt) across the SCR main current path, and change in current with respect to time (di/dt) flowing through the SCR main current path, must be limited to given maximum values. Similarly, for gate-turn-off (GTO) devices, the dv/dt and di/dt must be controlled to avoid excessive power dissipation. Another example is that of bipolar transistor switches, which must be operated within a prescribed Safe Operating Area (SOA), via tailoring of a load line.

In applying bipolar transistors, for example, for switching high magnitudes of current at high levels of voltage, the peak power dissipation of the transistors must be limited during turning on and turning off the transistor, that is, the bipolar transistor must be "electrically snubbed". Such snubbing circuitry is typically provided to limit the rate of collector current increase through a power transistor during the turn-on cycle, until a time that the voltage across the collector and emitter electrodes of the transistor decreases to a level permitting a high-magnitude of current flow therethrough without creating excess power dissipation in the transistor. Similarly, during turnoff of a power transistor conducting high-magnitudes of current, snubber circuitry limits the rate of voltage increase across the collector and emitter electrodes of the transistor during its turn-off cycle, whereby the level of voltage is permitted to increase at a rate relative to the decrease in the magnitude of the current therethrough as the transistor turns off, for insuring that the peak power dissipation does not exceed the design limits of the transistor. It is known to use passive electrical snubber circuits to limit peak power dissipation in the bipolar transistors and other solid-state switches during times of turnon and turnoff, for preventing damage or destruction of the transistor. An inductor is commonly connected in series with the collector circuit of a bipolar switching transistor for limiting the rate of current increase during the turn-on time for the transistor. Also, it is common to connect a capacitor across the collector and emitter electrodes of the transistor, whereby the capacitor limits the rate of voltage increase across the collector and emitter electrodes during the turn-off time for the transistor. In high-power switching applications, such passive snubber circuits do protect the switching transistor, but the snubbers do not eliminate switching losses in that such losses are essentially transferred from the transistor to the snubbing circuit. Also, such snubbing components are typically discrete in form, requiring a considerable portion of the limit space on a printed-circuit board, increasing the assembly cost in manufacturing, along with decreasing reliability because of the number of components required for reliable snubbing.

In one embodiment of this invention, the present inventor discovered that a first switching semiconductor device serving as a primary output device having relatively high power dissipation rating during the period of time that it is turned on, but having a low peak power dissipation rating for switching high-magnitudes of current at high-levels of voltage, can be effectively snubbed during its times of turning on and turning off, by connecting the main current path of a second switching semiconductor device across the main current path of the first switching semiconductor device. The second transistor has a substantially higher peak power dissipation rating than the first switching semiconductor device and a relatively higher power dissipation during its conduction period. Thereby the second switching semiconductor device is turned on prior to turning on or turning off the first switching semiconductor device. This insures the voltage across the main current path of the first switching semiconductor device being substantially reduced below the level of the operating voltage, that is, to the voltage across the main current path of the second switching semiconductor device while it is conducting. There is thus a substantial reduction of the peak power dissipation of the first switching semiconductor device while it is turning on and turning off, whereby the first and second switching semiconductor devices in effect complement one another and in many applications can be fabricated on the same substrate.

In the drawing, wherein like items have the same reference designation.

Figure 1:
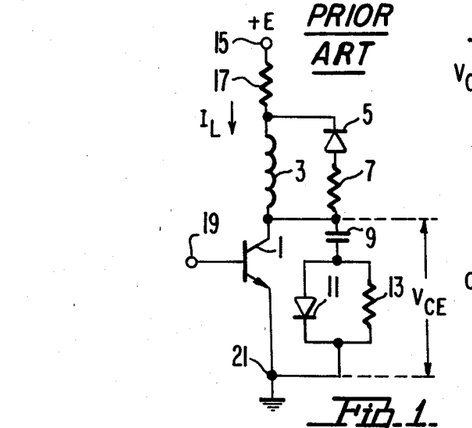
FIG. 1 is a schematic circuit diagram of a transistorized switching circuit including typical passive snubbing circuitry of the prior art.

In FIG. 1, a switching transistor 1 is protected by snubber circuitry of the prior art including an inductor 3, a diode 5, a power dissipating resistor 7, a capacitor 9, another diode 11, and another current-limiting resistor 13. Basically, the inductor 3 limits the rate of increase of the magnitude of the collector or load current $I_L$ during the turn-on time of the transistor 1, and the capacitor 9 limits the rate of voltage increase across the collector and emitter electrodes of transistor 1 during the turn-off time at transistor 1, as previously mentioned. The diode 5 and resistor 7 provide a current conduction path for dissipation of the stored energy in inductor 3 after turn-off time of transistor 1. Diode 11 provides a low-impedance unidirectional current path for rapidly charging the capacitor 9 during the turn-off time of transistor 1, and resistor 13 controls the discharge time constant for capacitor 9 during turn-on of the transistor 1.

For purposes of explanation, assume that the NPN power transistor 1 is rated for 100 amperes maximum collector current ($I_c$), 500 volt maximum collector-to-emitter voltage ($V_{CE}$), with a rise and fall time for the collector current of about 2 microseconds. Accordingly, it can be shown that for effective snubbing, the typical value of inductor 3 is about 10 microhenrys, and the typical value for the capacitor 9 is about 0.6 microfarads. Assuming these values for the inductor 3 and capacitor 9, if the circuit of FIG. 1 is operated at a 1000 $H_z$ switching rate, the power dissipation $P(R_{13})$ in the snubber resistor 13 can be calculated from the following Equation 1:

$$P(R_{13}) = \tfrac{1}{2} CE^2 f \quad (1)$$

where C is capacitance in microfarads, E is the level of operating voltage in volts, and f is frequency in hertz (Hz). From the values assumed, if the operating voltage E applies 500 volts to operating voltage terminal 15, then for the example given, the average power dissipation in snubber resistor 13 can be shown to be about 75 watts. The power dissipation $P(R_7)$ in the resistor 7 can be determined from Equation 2:

$$P(R_7) = \tfrac{1}{2} LI^2 f \quad (2)$$

where L is the value of the inductor 3 in henrys, I is the magnitude of the load current $I_L$ in amperes, and f is the frequency in hertz of switching for the switching circuit of FIG. 1. Assuming that the impedance of the load 17 causes a load current $I_L$ of 100 amperes magnitude during the on-time of transistor 1, from the assumed values and Equation (2), the power dissipation in resistor 7 is about 50 watts. Accordingly, from the example given, the total power dissipation of the snubber circuit of FIG. 1 is about 125 watts. In effect, the snubbing network of FIG. 1 transfers the power dissipation that would occur in transistor 1 during the times of turning-on and turning-off this transistor, from the transistor to the snubber resistors 7 and 13. Thus, as is well known, the snubbing circuitry does not eliminate switching losses, but merely transfers the loss from the switching device to the snubber circuitry, in this example primarily resistors 7 and 13, leaving unaltered the total loss of the switching circuit.

Figure 2:
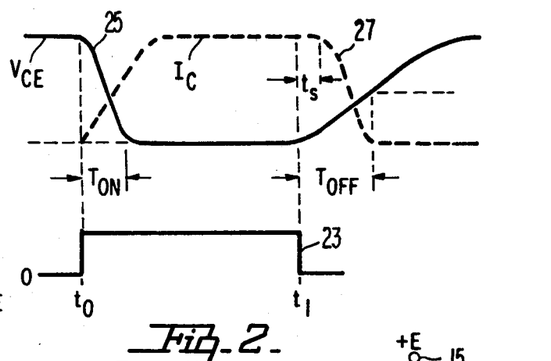
FIG. 2 includes typical control and output waveforms associated with the circuit of FIG. 1.

Typical waveforms associated with the operation of the prior art switching circuit of FIG. 1 are shown in FIG. 2. As shown, a control signal 23 is applied to input terminal or control terminal 19 of FIG. 1 at a time $t_0$, for forward biasing the base-emitter junction of transistor 1 and supplying base current thereto. In response to the positive-going control signal 23 at time $t_0$, the transistor 1 turns on in a time $T_{on}$ of about 2 microseconds. Waveform 25 represents the voltage ($V_{CE}$) across the collector and emitter electrodes of transistor 1, and waveform 27 represents the collector current ($I_c$) of transistor 1. As shown, $V_{CE}$ decreases exponentially in level towards some minimum value, and $I_c$ increases exponentially in magnitude towards some maximum value, during the $T_{on}$ time of transistor 1. In this example, at time $t_1$, the level of the control signal 23 decreases abruptly to about 0 volt, causing transistor 1 to turn off in a time period $T_{off}$ that is typically somewhat greater than its $T_{on}$ time. As shown, just after time $t_1$, Vce increases exponentially towards some maximum level, in this case 500 volts, whereas the decrease in magnitude of $I_c$ is delayed for a period of time known as the storage time $t_s$, and then begins to decrease exponentially in magnitude towards some minimum value in a time period known as the fall time $t_f$. In this example, the emitter electrode of transistor 1 is returned to a point of reference potential, ground in this example, via its connection to reference terminal 21.

Figure 3:
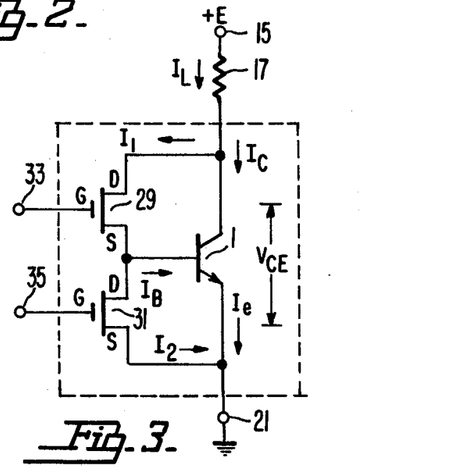
FIG. 3 is a circuit schematic diagram of a first embodiment of the invention.
Figure 4:
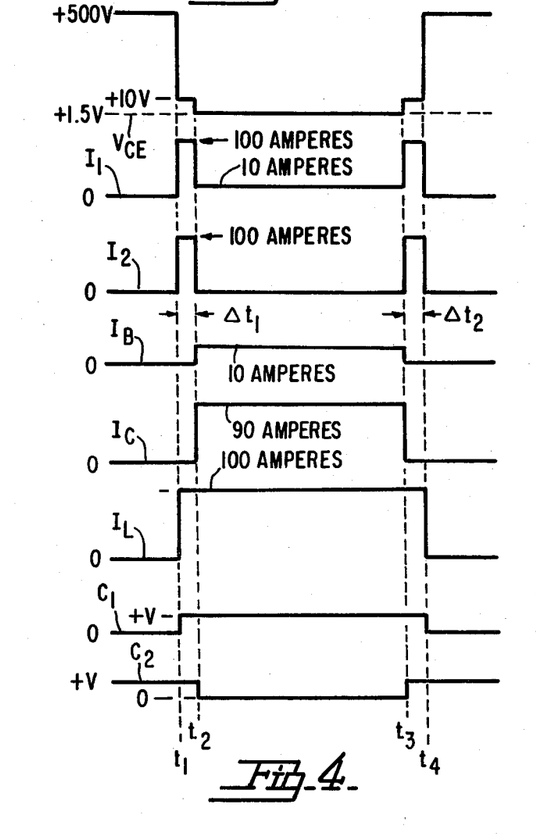
FIG. 4 indicates typical (idealized) waveforms associated with the operation of the circuit of FIG. 3.

In FIG. 3, a first embodiment of the invention, as illustrated as including a relatively high-voltage field-effect transistor 29, and a relatively low-voltage field-effect transistor 31, for both controlling the operation of transistor 1 and providing snubbing thereof, as described below. For the connections shown, the drain, source and gate electrodes of field-effect transistors 29 and 31 are designated by the letters D, S, and G, respectively. For purposes of illustration, assume that the operating voltage E applied to operating voltage terminal 15 has a level of +500 volts, and that the impedance of the load 17 is about 5 ohms. With reference to the waveforms of FIG. 4, prior to time $t_1$, a control signal $C_1$ is applied to control terminal 33, and a second control signal $C_2$ is applied to control terminal 35, with levels of 0 volt and +V volts, respectively. The value of +V is typically 10 volts. For this example, the field-effect transistors 29 and 31 are turned on in response to a positive-going control signal (a "high" signal), and are turned off when the control signal is "low" or has a level of about 0 volt. Accordingly, prior to the occurence time $t_1$, transistor 31 is turned on and transistor 29 is turned off. Further assume, in this example, that transistors 29 and 31 have an impedance between the drain and source electrodes thereof of at least several megohms each when turned off, and of about 0.1 and 0.005 ohm, respectively, when turned on. Accordingly, bipolar transistor 1 is held in a non-conductive state prior to time $t_1$ by the low impedance current conduction path of field-effect transistor 31 connected between the base and emitter electrodes of transistor 1. In other words, prior to time $t_1$, relatively speaking, the impedance between the collector and base electrodes of transistor 1 is an open circuit whereas the impedance between the base and emitter electrodes of this transistor 1 is substantially a short circuit. At time $t_1$ control signal $C_1$ goes "high", that is, from 0 to +10 volts, in this example, concurrently with control signal $C_2$ remaining "high". This change in level in $C_1$ causes field-effect transistor 29 to turn on, causing a load current $I_L$ of about 98.0 amperes to flow from operating voltage terminal 15, through the series connected main current paths of field-effect transistors 29 and 31, to ground.

In this example, the combined impedances of field-effect transistors 29 and 31 when turned on are about equal to the on 0.1 ohm impedance of transistor 29 alone, in that the low-voltage field-effect transistor 31 has an "on impedance" in the low milliohm range. Accordingly, very shortly after time $t_1$, the VCE level of transistor 1, equal to the level of voltage across the drain-source current paths of field-effect transistors 29 and 31, drops to about +10 volts as shown in the $V_{CE}$ waveform of FIG. 4. Also, just after time $t_1$, the magnitude of the current $I_L$, and current $I_1$ and $I_2$ have a magnitude of about 98 amperes. The load current $I_L$ flowing after time $t_1$, as a result of field-effect transistors 29 and 31 being concurrently turned on, causes power dissipation level in the main current paths of these transistors (mainly in transistor 29) of about 1000 watts, in this example. At time $t_2$, control signal $C_2$ goes low, whereas control signal $C_1$ remains high, causing field-effect transistor 31 to turn off and field-effect transistor 29 to remain on. In turn, an initial base current $I_B$ of a magnitude of about 98 amperes now flows into the base electrode of transistor 1 via the main current conduction path of transistor 29 and load impedance 17, causing transistor 1 to turn on. It is important to note that transistor 1, at the turn-on time, is effectively snubbed since at time $t_2$ the voltage at its collector electrode is close to +10 volts via the previous current conduction of transistors 29 and 31. Transistor 1, after time $t_2$, rapidly turns on to a level that is typically just out of saturation, whereby the voltage across the collector and emitter electrodes of transistor 1 is typically +1.5 volts. When transistor 1 is so turned on, assuming that the voltage between its base and emitter electrodes is about 0.6 volt with the static value of $I_B$ being at about 10 amperes, $I_L$ is at about 100 amperes, and the collector current $I_C$ at about 90 amperes. Accordingly, shortly after time $t_2$, the total power dissipation for the switching circuit is about 160 watts, 10 watts being dissipated by transistor 29, 60 watts being dissipated in the base-emitter junction of transistor 1 assuming a voltage drop thereacross of 0.6, and 90 watts in the collector-base path thereof. Also note that as shown, just after time $t_2$, the magnitude of the current $I_2$ decreases from 100 amperes to substantially 0 ampere, when field-effect transistor 31 turns off.

Bipolar transistor 1 is turned off in the reverse manner to its being turned on as previously described. For example, at time $t_3$ control signal $C_2$ goes high, causing field-effect transistor 31 to turn on, for shunting current away from the base of transistor 1 to a point of reference potential, ground in this example. Since bipolar transistor 1 is conducting out of saturation, it responds by rapidly turning off just after time $t_3$, but the voltage at its collector electrode ($V_{CE}$) only rises from about +1.5 volts to +10 volts, because of the concurrent conduction of field-effect transistors 29 and 31, as previously described. Accordingly, high power transistor 1 is effectively snubbed during turn-off in the same manner as during turn-on. The turn-off cycle for bipolar transistor 1 is completed at time $t_4$, when control signal $C_1$ goes low, turning off field-effect transistor 29, concurrent with field-effect transistor 31 being retained in its turned-on condition via the maintenance of $C_2$ at a high level. It is important to note that high-voltage field-effect transistors, such as transistor 29, are presently available with peak power dissipation ratings meeting the requirements of the circuit of FIG. 3 for the values of voltage and magnitudes of current assumed (VMOS and DMOS devices, for example). Also, the period of time between $t_1$ and $t_2$, and $t_3$ and $t_4$, is typically short, between 1 and 5 microseconds.

The advantages of dynamic snubbing, as provided by the first embodiment of the invention described above, are many, including reduced cost and enhanced reliability derived from the elimination of plural passive components required by the prior art snubbing circuitry, increased switching speeds, and reduced switching losses as described infra. Using the previously assumed values in illustrating the operation of circuit of FIG. 3, it can be shown that at a switching rate of 1000 hertz, the switching loss for the circuit of FIG. 3 is less than 10 watts, a significant improvement over the prior art snubber circuit of FIG. 1, which has a switching loss of about 125 watts under the same conditions.

Figure 5:
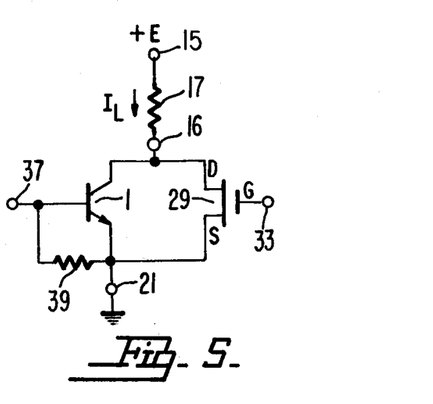
FIG. 5 is a circuit schematic diagram of a second embodiment of the invention.

In FIG. 5, a second and preferred embodiment of the invention is shown. In this preferred embodiment, the low-voltage field-effect transistor 31 of the first embodiment has been eliminated, and the high voltage field-effect transistor 29 has its drain and source electrodes connected to the collector and emitter of electrodes of bipolar transistor 1. The base electrode of transistor 1 is connected to a control terminal 37, and the load impedance 17 is connected between output terminal 16 and supply voltage terminal 15. Resistor 39, connected between the base and emitter electrodes of transistor 1, insures turn off of transistor 1 when a 0 bias is applied across terminals 37 and 21, a typical value for resistor 39 being about 2 ohms.

Figures 6, 7, 8, 9, 10:
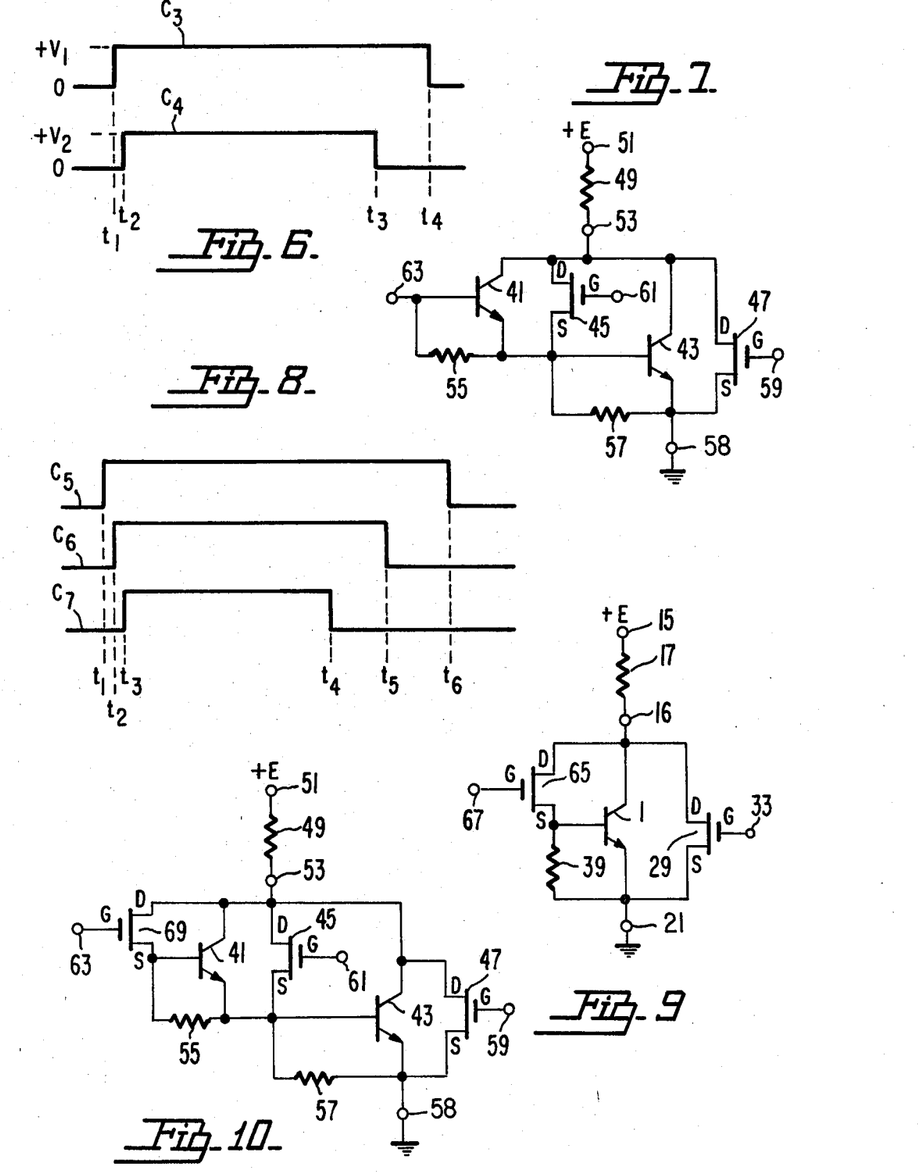
FIG. 6 includes typical waveforms of control signals for operating the circuit of FIG. 5.
FIG. 7 is a circuit schematic diagram of a third embodiment of the invention.
FIG. 8 includes typical waveforms of control signals for operating the circuit of FIG. 7.
FIGS. 9, 10, and 12 are circuit schematic diagrams of fourth, fifth, and sixth embodiments, respectively, of the invention.

With reference to the waveforms for control signals $C_3$ and $C_4$ of FIG. 6, the circuit of FIG. 5 is operated by applying control signal $C_3$ to control terminal 33, and control signal $C_4$ to control terminal 37. Prior to time $t_1$, control signals $C_3$ and $C_4$ are low, causing bipolar transistor 1 and field-effect transistor 29 to each be turned off or non-conductive. At time $t_1$, control signal $C_3$ goes high, to a level of $+V_1$ in this example, causing field-effect transistor 29 to turn on. Again assume that the level of the operating voltage $+E$ is about 500 volts, the load impedance of load 17 is about 5 ohms, and the impedance between the drain and source electrodes of field-effect transistor 29 when turned on is about 0.1 ohm. Accordingly, a load current $I_L$ having a magnitude of about 98 amperes flows through the current path including the load 17, and the channel between the drain and source electrodes of field-effect transistor 29 to ground, when transistor 29 turns on. When so turned on, transistor 29 has a voltage drop between its drain and source electrodes of about 10 volts, which level of voltage is directly applied across the collector and emitter electrodes of bipolar transistor 1.

At time $t_2$, the level of control signal $C_4$ goes high, concurrent with the level of control signal $C_3$ remaining high, causing bipolar transistor 1 to turn on in about 2 microseconds. Assuming that transistor 1 is driven into saturation by control signal $C_4$ going to $+V_2$ volts, the typical voltage drop at this time across the collector and emitter electrodes thereof will be about 1 volt, with a resistance therebetween of about 10 milliohms.

Accordingly, by turning on transistor 29 before turning on transistor 1, transistor 1 is effectively snubbed via the voltage drop across the drain and source electrodes of transistor 29. In this example, when transistor 29 is turned on with transistor 1 turned off, the power dissipation of transistor 29 is about 1000 watts. After time $t_2$, with both transistors 1 and 29 turned on, the power dissipation in transistor 1 (including about 10 watts of base drive power) is about 100 watts, and in transistor 29 about 10 watts; currents of about 90 and 10 amperes respectively flow through transistors 1 and 29, by virtue of the turn on impedance (the turn on impedances between the collector and emitter electrodes of transistor 1 and between the drain and source electrodes of transistor 29 being assumed to be 10 milliohms to and about 100 milliohms, respectively). Accordingly, after transistor 1 is turned on, the power dissipation in the switching circuit decreases from 1000 watts to about 100 watts. The control signal example of FIG. 6 field-effect transistor 29 is maintained in a turned-on state during the entire period while transistor 1 is turned on. At time $t_3$, control signal $C_4$ goes low, turning off bipolar transistor 1, which is effectively snubbed by the continued conduction of field-effect transistor 29, which stays on via control signal $C_3$ remaining high after time $t_3$. In this manner, transistor 29 provides turn-off snubbing for bipolar transistor 1. The turn-off cycle is completed at time $t_4$ when control signal $C_3$ goes low, turning off field-effect transistor 29. If transistor 29 is turned off during the predominant period of time between $t_2$ and $t_3$ that transistor 1 is turned on, in order to snub transistor 1 during its turn-off cycle, one must turn transistor 29 back on before permitting bipolar transistor 1 to begin turning off.

The advantage of the preferred embodiment of FIG. 5 is that one less field-effect transistor is required than in the first embodiment of the invention, the overall power dissipation of the circuit is reduced, and the bipolar and field-effect transistors can be more easily fabricated on the same substrate to provide a self-snubbing switching device. In effect, the bipolar transistor 1 and field-effect transistor 29 complement one another, in that the field effect transistor 29 provides both snubbing of bipolar transistor 1 and initial turn-on of the circuit of FIG. 5, whereas the bipolar transistor 1 when turned on provides reduced power dissipation of the overall circuit, improving the power efficiency of the circuit.

A third embodiment of the invention illustrated in FIG. 7 for snubbing bipolar transistors connected in a Darlington configuration is an extension of the second embodiment. The Darlington circuit includes two bipolar transistors 41 and 43, snubbed by field-effect transistors 45 and 47, respectively. A load impedance 49 is connected between terminals 51 and 53. Two relatively low valued resistors 55 and 57, respectively connected between the base and emitter electrodes of bipolar transistors 41 and 43, insure turn-off of the bipolar transistors under conditions of zero bias.

In operating this circuit, the turn-on cycle is initiated by sequentially turning on field-effect transistor 47 for snubbing bipolar output transistor 43. Next, field-effect transistor 45 is turned on, both for snubbing input bipolar transistor 41 and providing base current to output bipolar transistor 43. Then transistor 43 is turned on, followed by turning on input bipolar transistor 41, to complete the turn-on sequence. Turn-off of the circuit is performed in the opposite sequence of turn-on.

With reference to FIG. 8, such operation of the circuit of FIG. 7 can be provided by applying control signals $C_5$, $C_6$, and $C_7$ to control terminals 59, 61, and 63, respectively. In this example, prior to time $t_1$, all of the control signals are low, maintaining field-effect transistors 45 and 47, and bipolar transistors 41 and 43 turned off. At time $t_1$, control signal $C_5$ goes high, turning on field-effect transistor 47. Shortly thereafter at time $t_2$ control signal $C_6$ goes high, for turning on field-effect transistor 45, causing current to flow from operating voltage terminal 51, through the load 49, the drain and source electrodes of field-effect transistor 45, to the base electrode of bipolar transistor 43, turning on the latter. Transistor 43 is thereby snubbed via the relatively low voltage across the drain and source electrodes of previously turned on field-effect transistor 47. At time $t_3$ control signal $C_7$ goes high, causing bipolar turn on transistor 41, snubbed by the previous turn-on of field-effect transistor 45. The turn-off cycle is initiated at time $t_4$ when control signal $C_7$ goes low, turning off bipolar transistor 41, snubbed at that time by the continued turn-on of field-effect transistor 45. At time $t_5$, control signal $C_6$ goes low, causing field-effect transistor 45 to turn off, thereby interrupting the flow of base current to bipolar transistor 45, causing the latter to turn off. The turn-off sequence is completed at time $t_6$ when waveform $C_5$ goes low, causing field-effect transistor 41 to turn off. In a similar manner, any number of cascaded bipolar transistors or switching devices can be each snubbed by individual field-effect transistors, for example.

A fourth embodiment of the invention illustrated in FIG. 9 includes the addition of a field-effect transistor 65 to the circuit of FIG. 5. Field-effect transistor 65 has drain and source electrodes connected between the collector and base electrodes, respectively, of bipolar transistor 1, and a gate electrode connected to a control terminal 67. This addition of field-effect transistor 65 enhances the operation of a circuit by providing a higher input impedance, reducing the turn-on and turn-off times for the bipolar transistor 1 by insuring that the latter is kept out of saturation via the connection of the low impedance of the channel between the drain and source electrodes of transistor 65, when turned on, to provide negative feedback between the collector and base electrodes of transistor 1; the feedback also greatly enhances the transient current capability of bipolar transistor 1. Similarly, a fifth embodiment of the invention (see FIG. 10) includes the addition of a field-effect transistor 69 to the circuit of FIG. 7. In the embodiments of FIGS. 9 and 10, field-effect transistors 65 and 69, respectively are, high-voltage, power field-effect transistors, such as VMOS or DMOS power FET's. A detailed description of the advantages of so connecting a power field-effect transistor with a bipolar transistor is given in my copending application, Ser. No. 41,008, filed May 21, 1979, for VMOS/BIPOLAR POWER SWITCH.

Operation of the circuit of FIG. 9 is similar to operation of FIG. 5, except that with the former an appropriate control signal is applied to the control terminal 67 for turning on field-effect transistor 65 to supply base current to transistor 1, instead of applying a control signal directly to the base of the bipolar transistor 1, as in the latter. In other words, field-effect transistor 65 is turned on and off for turning on and off bipolar transistor 1, but only while field-effect transistor 29 is turned on for snubbing transistor 1, as previously described. Similarly, for the fifth embodiment of the invention, FIG. 10, field-effect transistor 69 is turned on and off for turning on and off bipolar transistor 41, only while field-effect transistor 45 is turned on for snubbing bipolar transistor 41, the operation otherwise being identical to that for the circuit of FIG. 7.

A well-known phenomenon associated with bipolar transistors is "latchback". The collector-to-base breakdown voltage with emitter open ($V_{CBO}$) and collector-to-emitter breakdown voltage with base open ($V_{CEO(SUS)}$) of bipolar transistors depend primarily upon crystal doping concentrations and thickness of the collector and base regions. For high-gain power transistor structures, where the current gain or beta ($\beta$) is greater than 10, $V_{CEO(SUS)}$ is related to $V_{CBO}$ by Equation 3:

$$V_{CEO(SUS)} \approx \frac{V_{CBO}}{\sqrt[N]{1+\beta}} \quad (3)$$

where N is approximately equal to 4.

Figure 11:
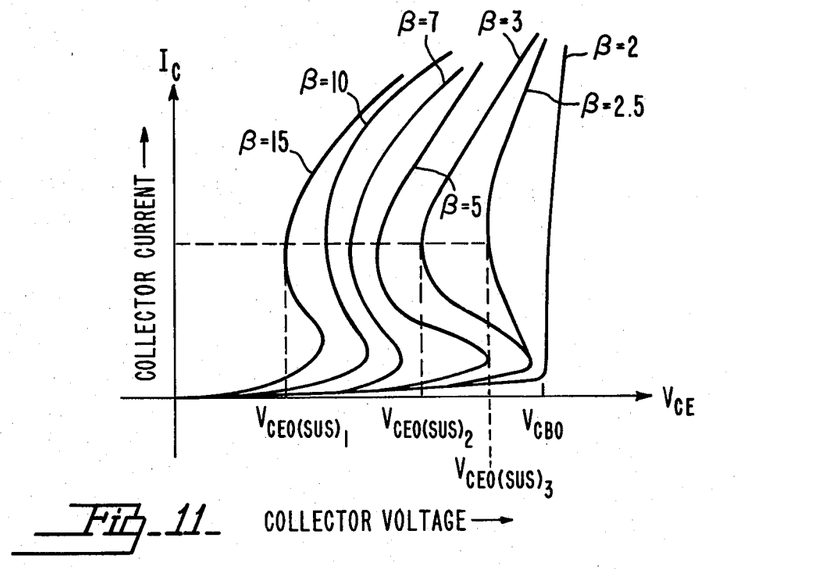
FIG. 11 is a family of curves illustrating the latchback phenomena of bipolar transistors.

As indicated by Equation 3, the magnitude of $V_{CEO(SUS)}$ is inversely related to the current gain, and can therefore be increased by decreasing the $\beta$ of the bipolar transistor. In FIG. 11, collector current $I_c$ versus the voltage between the collector and emitter electrodes $V_{CE}$ of a bipolar transistor is shown for different values of current gain. As shown, when a bipolar transistor is designed for low current gain, less than about 3, $V_{CEO(SUS)}$ approaches the value of $V_{CBO}$, and the latchback phenomenon substantially disappears. For example, for a given level of collector current $I_c$ and a particular transistor, transistors having $\beta$'s of 15, 3 and 2.5, have collector-to-emitter breakdowns of $V_{CEO(SUS)1}$, $V_{CEO(SUS)2}$, and $V_{CEO(SUS)3}$, respectively. $V_{CEO(SUS)}$ is equal to $V_{CBO}$ for a $\beta$ of 2 in this example. This latchback phenomenon is caused by positive feedback within the bipolar transistor, whereby at relatively low magnitudes of current $I_c$, small increases in the magnitude of this collector current cause increases in the current gain of the transistor in a regenerative manner, until the current gain stops rising as a function of increasing collector current.

Figure 12:
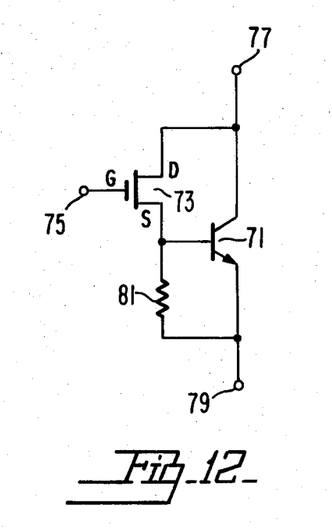

In FIG. 12 is illustrated a switching device and circuit are which facilitate the use of low gain bipolar transistor 71 in combination with power field-effect transistor (FET) 73, for providing a high power gain. This combination represents a sixth embodiment of the invention. The bipolar transistor 71, in the preferred embodiment, has a current gain of about 3, for avoiding the latchback phenomenon, with the FET 73 providing a high-input impedance for the device 71,73, thereby avoiding the inherent low-input impedance of the low gain bipolar transistor 71. The operation of the circuit of FIG. 12 is similar to the above description of the operation of FET 65 in combination with bipolar transistor 1, as shown in FIG. 9, for the fourth embodiment of the invention. However, the present inventor discovered that by using a low gain bipolar transistor 71 in combination with a relatively low-power FET 73, he could provide an active snubber circuit and device 71,73 that makes better utilization of the silicon area than a relatively high-power FET, such as FET 29, used as an active snubber in FIG. 9. The active snubber of FIG. 12 also includes a control terminal 75, for receiving a control signal; output terminals 77 and 79 for connection across the main current path of a power semiconductor switch, for providing active snubbing; and a relatively low value input resistor 81. One limitation of the circuit of FIG. 12 is that the low $\beta$ bipolar transistor 71 produces a relatively high on-voltage, as shown from Equation 4:

$$V_{CE(ON)} = V_{BE} + I_L \left( \frac{r_{on}}{1+\beta} \right) \quad (4)$$

where
$V_{CE(ON)}$ is the voltage between the collector and emitter electrodes of transistor 71, when turned on.
$V_{BE}$ is the voltage between the base and emitter electrodes of transistor 71.
$I_L$ is the current supplied from terminal 77; and $r_{on}$ is the impedance between the drain and source electrodes of FET 73 when turned on.

However, for the application of "active snubbing", the level of $V_{CE}(ON)$ is not a problem, as shown below. This high $V_{CE}(ON)$ may be a problem if the circuit of FIG. 12 is used as the primary switching circuit for selectively applying power to a load. In the latter application, it may be desirable to increase the current gain of bipolar transistor 71 at the sacrifice of efficient utilization of a silicon substrate for an integrated circuit device 71,73, to provide a lower $V_{CE}(ON)$. As previously mentioned, this is not necessary where the device 71,72 is used in "snubbing" applications.

Figure 13:
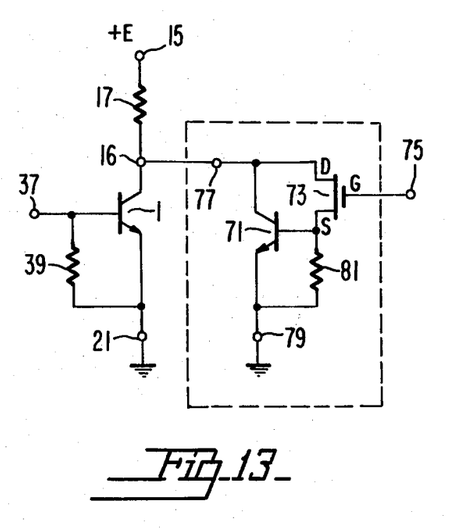
FIG. 13 is a circuit schematic diagram showing an application of the sixth embodiment of the invention.

Assume for the purposes of further description, that the active snubbing device or circuit of FIG. 12 is substituted for the high-power FET 29 of FIG. 5, for snubbing the output bipolar power transistor 1, as shown in FIG. 13. The power FET 73 can have a substantially lower power rating than FET 29, because of the combination of FET 73 with bipolar transistor 71. It can be shown that the required power rating of FET 73 can be less than the power rating of FET 29, by a factor of about $(1+\beta)$. Accordingly, the active snubbing device 71,73, when provided as an integrated circuit, functions as a high-power FET with the bipolar transistor 71 dissipating most of the power that is snubbed. The total chip area of snubbing device 71,73 is much less than that of FET 29 for snubbing the same level of power.

The operation of the circuit of FIG. 13 is now be described. Assume that the high gain bipolar power transistor 1 has a rated $V_{CBO}$ of 500 volts, and $V_{CEO}$ of 187 volts. Accordingly, it is necessary to snub transistor 1 while it is turned on or off, for ensuring that its $V_{CEO}$ is limited to less than 187 volts with typically less than 2 amperes of collector current flowing. Further assume that for the "active snubber", bipolar transistor 71 has a $\beta$ of 2, FET 73 has an $r_{on}$ of about 2 ohms, +E is 450 volts, transistor 1 has a $\beta$ of 50 (at 2 amperes) and 10 (at 100 amperes), and that the load 17 has an impedance of 4.5 ohms. First, a positive going control signal is applied to control terminal 75, for turning on FET 73, causing about 33 amperes of base current to flow in bipolar transistor 71 for turning on this transistor, causing about 66 amperes of current to flow through the collector-emitter current path of transistor 71. The active snubber 83 is now turned on. Accordingly, for this example, from equation (4), the $V_{CE}(ON)$ of active snubber 83 is equal to about $(100)(2/1+2)$ volts, or about 66 volts, where $I_L$ is about 100 amperes. Output transistor 1 can now be turned on (by applying a positive going control signal to input terminal 37) with only 66 volts of collector voltage, well below the transistor $V_{CEO}$ rating of 187 volts. Turn-off snubbing of transistor 1 is accomplished by turning off output transistor 1 while maintaining snubber 83 turned on, when the collector current of transistor 1 goes to zero, snubber 83 is turned off.

The circuits for each embodiment of the present invention can for many applications be integrated circuits, using present technology. The present inventor views such integrated circuits as self-snubbing high-power switching devices. The present inventor further views his invention as Bipolar Output Field-Effect Transistor switching devices, for which he has coined the generally descriptive name of BIOFET.

What is claimed is:
1. A high-voltage, high-current, solid-state switching circuit, comprising:

an operating voltage terminal for receiving an operating voltage;

a reference terminal for connection to a point of reference potential;

first and second input terminals for receiving first and second control signals, respectively;

a first semiconductor switching device having a main current path connected between said operating voltage and reference terminals, and a control electrode connected to said first input terminal, said first switching device being operable, in response to different levels of said first control signal applied to said control electrode, to a turned-on condition where its main current path has a relatively low impedance providing relatively low power dissipation, and to a turned-off condition where its main current path has a relatively high impedance, said first switching device being characterized by susceptibility to damage due to peak power dissipation therein caused by the application of high-operating voltage across the main current path, concurrent with high current therethrough, during the time intervals for turning on and turning off said device, respectively;

a second semiconductor switching device having a main current path connected across the main current path of said first switching device, and a control electrode connected to said second input terminal, said second switching device being operable, in response to different levels of said second control signal applied to said control electrode, to a turned-on condition where its main current path has relatively low impedance, and to a turned-off condition where its main current path has a relatively high impedance, said second switching device being characterized by the capability to withstand high peak power in switching from one of its turned-on or turned-off conditions to the other, its main current path having a substantially higher impedance relative to the impedance of said first switching device in their turned-on conditions, causing the latter to have a substantially lower power dissipation when individually turned on than the former under like conditions of load, operating voltage level, and current;

said solid-state switching circuit being operable for turning on said second switching device before turning on said first switching device, and for turning off said first switching device only at times said second switching device is turned on, thereby snubbing or protecting said first switching device from excessive peak power dissipation by ensuring that this device is turned on and turned off only at times that the level of voltage across its main current path is substantially lower than the level of said operating voltage.

2. The high-voltage, high-current, solid-state switching circuit of claim 1, wherein said first switching device includes a first bipolar power transistor having a collector electrode connected to said operating voltage terminal, an emitter electrode connected to said reference terminal, and a base electrode connected to said first input terminal.

3. The high-voltage, high-current, solid-state switching circuit of claim 2, wherein said second switching device includes a field-effect power transistor having a drain electrode connected to said operating voltage terminal, a source electrode connected to said reference terminal, and a gate electrode connected to said second input terminal.

4. The high-voltage, high-current, solid-state switching circuit of claim 1, wherein said first switching device includes:

second bipolar power transistors each with a collector electrode connected to said operating voltage terminal, the former having a base electrode connected to said first input terminal, and an emitter electrode connected to a base electrode of the latter, the latter also having an emitter electrode connected to said reference terminal.

5. The high-voltage, high-current, solid-state switching circuit of claim 4, wherein said second switching device includes:

a first field-effect power transistor having drain, source, and gate electrodes connected to said operating voltage, reference, and second input terminals, respectively.

6. The high-voltage, high-current, solid-state switching circuit of claim 5, further including:

a third input terminal for receiving a third control signal;

a second field-effect power transistor having drain, source, and gate electrodes connected to said operating voltage terminal, base electrode of said second bipolar power transistor, and third input terminal, respectively;

said solid-state switching circuit being operable to a turned-on state by sequentially turning on said first field-effect power transistor for snubbing said second bipolar power transistor, next turning on said second field-effect power transistor for both snubbing said first bipolar power transistor and supplying base current to said second bipolar power transistor causing turning on of the latter out of saturation, and thereafter turning on said first bipolar power transistor for completing the turn-on cycle, said solid-state switching circuit being operable in the opposite sequence to its turned-off state.

7. The high-voltage, high-current, solid-state switching circuit of claim 2, or 4, or 5, or 6, further including a relatively low value resistor between the base and emitter electrodes of each one of said bipolar power transistors, for ensuring that said bipolar transistors turn off whenever zero bias is applied between their base and emitter electrodes.

8. The high-voltage, high-current, solid-state switching circuit of claim 2, or 3, or 4, or 5, or 6, further including:

another field-effect power transistor having a drain, source, and gate electrodes connected to said operating voltage terminal, the base electrode of said first bipolar power transistor, and said first input terminal, respectively, thereby providing said connection between said first input terminal and the base electrode of said first bipolar power transistor, said another field-effect power transistor being operable in response to said first control signal, for permitting current to flow between said base electrode and operating voltage terminal, for turning on said first bipolar power transistor out of saturation, permitting fast turn-off of the latter relative to its saturated conduction state, and for providing a high-input impedance for said solid-state switching circuit.

9. The high-voltage, high-current, solid-state switching circuit of claim 1, wherein said first switching device includes:
  bipolar power transistor switching means having a collector electrode connected to said operating voltage terminal, an emitter electrode connected to said reference terminal, and a base electrode; and
  a first field-effect power transistor having drain, source and gate electrodes connected to said operating voltage terminal, said base electrode, and said first input terminal, respectively;
  the main current path of said first switching device being between the collector and emitter electrodes of said bipolar power transistor switching means.

10. The high-voltage, high current, solid-state switching circuit of claim 9, wherein said second switching device includes:
  said first field-effect power transistor; and
  a second field-effect power transistor having drain, source, and gate electrodes, connected to said base electrode, said reference terminal, and said second input terminal, respectively;
  the main current path of said second switching device being between the drain and source electrodes of said first and second field-effect power transistors, respectively;
  said second switching device being turned on whenever said first and second field-effect power transistors are concurrently turned on, and being turned off whenever at least said second field-effect power transistor is turned off;
  said first switching device being turned on whenever said first field-effect power transistor is turned on concurrent with said second field-effect power transistor being turned off.

11. The high-voltage, high-current, solid-state switching circuit of claim 1, wherein said second switching device includes:
  bipolar power transistor switching means having collector and emitter electrodes for connection between said operating voltage and reference terminals, respectively, for serving as the main current path of said second switching device, and a base electrode; and
  field-effect transistor means having a main current path connected between said base and collector electrodes of said bipolar power transistor switching means, and a gate electrode connected to said second input terminal, for serving as said control electrode of said second switching device.

12. The high-voltage, high-current, solid-state switching circuit of claim 11, wherein said bipolar power transistor switching means consists of a bipolar power transistor having a relatively low current gain for avoiding the latchback phenomena associated with bipolar transistors.

13. The high-voltage, high-current, solid-state switching circuit of claim 12, wherein said field-effect transistor means consists of a relatively low power field-effect transistor having for its main current path drain and source electrodes connected between said collector and base electrodes of said bipolar power transistor, respectively, said field-effect transistor providing a relatively high-input impedance for said second switching device, the former being turned on in response to said second control signal, whereby the impedance between its drain and source electrodes substantially reduces for both providing base current flow in said bipolar transistor, turning on the latter, and a negative feedback current path between the collector and base electrodes of said bipolar transistor, for improving the transient power capability of the latter.

14. A method of snubbing a first semiconductor switching device with a second semiconductor switching device, said first and second switching devices each having a main current path, and a control electrode for receiving first and second control signals, respectively, the control electrodes of said first and second switching devices being responsive to first levels of said first and second control signals, respectively, so the first and second switching devices are turned on to substantially reduce the relative impedances of their respective main current paths, the control electrodes of said first and second switching devices being respectively responsive to second levels of the first and second control signals so the first and second switching devices are turned off to increase the relative impedances of their respective main current paths, said first switching device being characterized by having a substantially lower impedance in its main current path when turned on relative to said second switching device when turned on, said first switching device being further characterized by susceptibility to damage due to peak power dissipation therein caused by the application of high-operating voltage across the main current path, concurrent with high current therethrough, during the time intervals for turning on and turning off this device, said second switching device being further characterized by the capability to withstand substantially higher peak power dissipation relative to said first switching device in switching from one of its turned-on or turned-off conditions to the other, the main current path of said second switching device being connected across the main current path of said first switching device, comprising the steps of:
  turning on said second switching device by applying the first level of the second signal to the central electrode of the second device concurrent with said first switching device being turned off in response to the second level of the first signal being applied to the control electrode of the first device, for substantially reducing the voltage level across the main current path of the latter to the voltage level across the main current path of the former;
  then, turning on said first switching device by applying the first level of the first signal to the control electrode of the first device while maintaining the said second switching device turned on by applying the first level of the second signal to the control electrode of the second device, the latter providing turn-on snubbing for the former; and
  then, turning off said first switching device by applying the second level of the first signal to the control electrode of the first device, while maintaining said second switching device turned on by applying the first level of the second signal to the control electrode of the second device, the latter providing turn-off snubbing for the former.

15. The method of claim 14, further including the step of turning off said second switching device by applying the second level of the second signal to the control electrode of the second device in the time period between the times of turning on and then turning off said first switching device.

16. A transistorized switching circuit operable for switching high-magnitudes of current at high-levels of voltage, comprises:
   a first terminal for receiving a source of operating voltage;
   a second terminal for receiving a source of reference voltage;
   bipolar switching transistor means having a collector electrode connected to said first terminal, an emitter electrode connected to said second terminal, and a base electrode;
   solid-state switching means having main current paths connected between said first and second terminals, first and second input terminals for receiving first and second control signals, respectively, and an output terminal connected to said base electrode, said solid-state switching means being responsive to said first and second control signals applied to the first and second input terminals sequentially operable to a first condition for preventing the flow of base current in said bipolar switching transistor means, thereby keeping the latter turned off with the voltage at said collector having a level substantially equal to that of said operating voltage, to a second condition for substantially reducing the level of voltage between said collector and emitter electrodes, while preventing the flow of base current in said bipolar switching transistor means, and to a third condition for permitting the flow of current between said first terminal and said base electrode of said bipolar switching transistor means, the current flow between the first terminal and said base electrode turning on the latter bipolar transistor to substantially reduce the level of impedance between the collector and emitter and permit load current to flow therebetween, said solid-state switching means being sequentially operable from its third, to its second, to its first conditions, for turning off said bipolar switching transistor means, whereby said solid-state switching means permits said bipolar switching transistor means to be turned on and off at times that the level of voltage at its collector electrode is substantially low relative to said operating voltage, thereby providing snubbing of said bipolar switching transistor means, for high-speed switching of high magnitudes of current at high levels of voltage.

17. The switching circuit of claim 16, wherein said solid-state switching means includes:
   a first switching transistor having a main current path connected between said collector and base electrodes, and a control electrode connected to said first input terminal;
   a second switching transistor having a main current path connected between said base and emitter electrodes; and a control electrode connected to said second input terminal;
   said first and second switching transistors being responsive to a "high" level of said first and second control signals, respectively, for substantially lowering the relative impedance of their respective main current paths, and to a "low" level of said first and second control signals, respectively, for substantially increasing the impedance of their respective main current paths, relative to said load impedance;
   said solid-state switching means being operable to its first condition in response to said first and second control signals having "low" and "high" levels, respectively, to its second condition in response to said first and second control signals each having a "high" level, and to its third condition in response to said first and second control signals having "high" and "low" levels, respectively.

18. The switching circuit of claim 17, wherein said first switching transistor consists of a high-voltage, field-effect transistor having a gate electrode for said control electrode, a drain electrode connected to said collector electrode, and a source electrode connected to said base electrode.

19. The switching circuit of claim 17 or 18, wherein said second switching transistor consists of a low-voltage, field-effect transistor having a gate electrode for said control electrode, a drain electrode connected to said base electrode, and a source electrode connected to said emitter electrode.

20. The switching circuit of claim 16, wherein said solid-state switching means includes:
   a first switching transistor having a main current path connected between said collector and emitter electrodes, and a control electrode connected to said first input terminal;
   a second switching transistor having a main current path connected between said collector and base electrodes, and a control electrode connected to said second input terminal; and
   a relatively low value resistor connected between said base and emitter electrodes, for ensuring turn-off of said bipolar switching transistor means whenever a zero bias exists between these electrodes;
   said first and second switching transistor means each being responsive to a "high" level of said first and second control signals, respectively, for substantially reducing the relative impedance of their respective main current paths and to a low level of said first and second control signals, respectively, for substantially increasing the relative impedance of their respective main current paths;
   said solid-state switching means being operable to its first condition in response to said first and second control signals each having a "low" level, to its second condition in response to said first and second control signals having "high" and "low" levels, respectively, and and to its third condition in response to said first and second control signals each having a "high" level.

21. The switching circuit of claim 20, wherein said first switching transistor consists of a field-effect transistor having a gate electrode as said control electrode, a drain electrode connected to said collector electrode, and a source electrode connected to said emitter electrode.

22. The switching circuit of claim 20 or 21, wherein said second switching transistor consists of a field-effect transistor having a gate electrode as said control electrode, a drain electrode connected to said collector electrode, and a source electrode connected to said base electrode.

23. The switching circuit of claim 16, wherein said bipolar switching transistor means includes a power Darlington transistor.

24. The switching circuit of claim 16, wherein said bipolar switching transistor means includes an NPN power transistor.

25. A method for operating a bipolar power transistor having base, collector, and emitter electrodes, for receiving a control current, an operating voltage, and a source of reference voltage, respectively, to switch high magnitudes of current at high-voltage levels, while providing active snubbing during turn-on and turn-off of the bipolar transistor, comprising the steps of:
(1) preventing the flow of base current in said bipolar power transistor for maintaining said transistor turned off by connecting a relatively high impedance between said collector and base electrodes; and connecting a relatively low value of impedance between said base and emitter electrodes;
(2) reducing substantially the level of voltage across said collector and emitter electrodes relative to the level of said operating voltage, for initiating a turn-on cycle;
(3) supplying current to the base electrode of said bipolar transistor for completing its turn-on cycle;
(4) removing the supply of base current from said base electrode, concurrent with limiting the rise of the level of the voltage at said collector electrode to that of step (2), for initiating the turn-off cycle for said bipolar transistor; and
(5) permitting the level of voltage at said collector electrode to substantially approach the level of said operating voltage, for completing the turn-off cycle.

26. The method of claim 25, wherein step (2) includes:
changing the value of impedance between said collector and base electrodes to a substantially low value relative to the value of said load impedance.

27. The method of claim 26, wherein step (3) includes:
substantially increasing the relative value of impedance between said base and emitter electrodes, for permitting current to flow between the base electrode of said bipolar transistor, said load impedance, and the impedance between said collector and base electrodes.

28. The method of claim 27, wherein step (4) includes:
substantially reducing the relative value of impedance between said base and emitter electrodes, for shunting current away from said base electrode to said source of reference potential.

29. The method of claim 28, wherein step (5) includes:
substantially increasing the relative value of impedance between said collector and base electrodes.

30. The method of claim 25, wherein step (1) includes:
connecting a substantially high value of impedance between said base and collector electrodes; and
connecting a relatively low impedance current path between said base and emitter electrodes.

31. The method of claim 30, wherein step (2) includes:
connecting a substantially low value of impedance relative to the value of impedance between said collector and emitter electrodes, at this time, across these electrodes.

32. The method of claim 31, wherein step (3) includes:
reducing substantially the value of impedance between said base and collector electrodes.

33. The method of claim 32, wherein step (4) includes:
increasing substantially the relative value of impedance across said base and collector electrodes.

34. The method of claim 33, wherein step (5) includes:
changing the value of impedance across said collector and emitter electrodes from a low to a high value, after said bipolar power transistor turns off.

35. A transistorized switching device, comprising:
a bipolar transistor having a collector electrode for receiving an operating voltage, an emitter electrode for connection to a source of reference potential, and a base electrode for receiving a first control signal; and
a field-effect transistor having drain and source electrodes connected to said collector and emitter electrodes, respectively, and a gate electrode for receiving a second control signal;
said transistorized switching device being operable for turning on said field-effect transistor before said bipolar transistor for substantially reducing the voltage across the collector and emitter electrodes of the latter, which is then turned on and off as desired at substantially reduced peak power dissipation via the snubbing effect of the field-effect transistor.

36. A transistorized switching device operable for switching high-magnitudes of current at high levels of voltage, comprises:
a first terminal for receiving an operating voltage;
a second terminal for connection to a source of reference potential;
a third terminal for receiving a first control signal;
a fourth terminal for receiving a second control signal;
bipolar switching transistor means having a collector electrode connected to said first terminal, an emitter electrode connected to said second terminal, and a base electrode;
a first field-effect transistor having a channel connected between said collector and base electrodes, and a gate electrode connected to said third terminal; and
a second field-effect transistor having a channel connected between said base and emitter electrodes, and a gate electrode connected to said fourth terminal, whereby said first and second field-effect transistors each have substantially high channel impedance when turned off, and relatively low channel impedance when turned on;
said transistorized switching device being operable in response to different combinations of levels of said first and second control signals, to a first condition having said first field-effect transistor turned off concurrent with said second field-effect transistor turned on, for maintaining said bipolar switching transistor means turned off, to a second condition having said first and second field-effect switching transistors concurrently turned on, thereby substantially lowering the level of voltage across said collector and emitter electrodes relative to said operating voltage, while preventing the flow of base current in said bipolar switching transistor means, maintaining the latter turned off, and to a third condition having said first field-effect switching transistor turned on, concurrent with said second field effect transistor being turned off for permitting base current to flow in said bipolar switching transistor means, turning on the latter, said transistorized switching device being turned on via sequential operation through its first through third conditions, and being turned off via sequential operation in the reverse order from turn-on, whereby said second condition provides both turn-on and turn-off snubbing of said bi-polar switching transistor means.

37. A transistorized switching device operable for switching high magnitudes of current at high levels of voltage, comprises:
   a first terminal for receiving an operating voltage;
   a second terminal for receiving reference potential;
   a third terminal for receiving a first control signal;
   a fourth terminal for receiving a second control signal;
   bipolar switching transistor means having a collector electrode terminal connected to a first terminal, an emitter electrode connected to said first terminal, and a base electrode;
   a first field-effect transistor having a channel connected between said collector and emitter electrodes, and a gate electrode connected to said third terminal; and
   a second field-effect transistor having a channel connected between said collector and base electrodes, and a gate electrode connected to said fourth terminal, said first and second field-effect transistors having substantially high channel impedances, when turned off, and substantially low channel impedances when turned on;
   said transistorized switching device being operable, in response to different combinations of levels of said first and second control signals, to a first condition, whereby said first and second field-effect transistors are turned off for maintaining said bipolar transistor means turned off, to a second condition whereby said first field-effect transistor is turned on, concurrent with said second field-effect transistor being turned off, thereby establishing a substantially low level of voltage across said collector and emitter electrodes relative to level of said operating voltage, with said bipolar switching transistor means being turned off, and to a third condition whereby said first and second field effect transistors are concurrently turned on, the turn-on of said second field-effect transistor permitting base current to flow in said bipolar transistor and, turning on the latter at a time that the voltage at its collector electrode is substantially lower than that of said operating voltage due to said first field-effect transistor being turned on, said transistorized switching device being turned on via the sequential operation of this device through its first through third conditions, and being turned off via sequential operation in the reverse order from turn-on, whereby said second condition provides both turn-on and turn-off snubbing of said bipolar switching transistor means.

38. The transistorized switching device of claim 37 further including:
   a relative low value resistor connected between said base and emitter electrodes, for ensuring said bipolar switching transistor means turns off whenever zero bias is applied therebetween.

39. An active device for "snubbing" the main current path of a power semiconductor switch, comprising:
   first and second terminals for connection to different ends of the main current path of said power semiconductor switch, respectively;
   a third terminal for receiving a control signal; and
   transistorized switching means having a main current path connected between said first and second terminals, and a control electrode connected to said third terminal, said transistorized switching means being operable in response to different levels of said control signal, to a turned-on condition in which its main current path has a relatively low impedance, and to a turned-off condition in which its main current path has a relatively high impedance, said transistorized switching device being characterized by the capability to withstand higher peak power than said power semiconductor switch, the main current path of said transistorized switching device also having a substantially higher impedance relative to the main current path of said power semiconductor switch when each is in its turned-on condition, said transistorized switching means being turned on at least prior to the times of turning on or turning off said power semiconductor switch, said transistorized switching means consists of a relatively high power field-effect transistor having drain and source electrodes connected to said first and second terminals, respectively, and a gate electrode connected to said third terminal.

40. The active "snubbing" device of claim 39, wherein said transistorized switching means includes:
   bipolar power transistor switching means having collector and emitter electrodes connected to said first and second terminals, respectively, and a base electrode; and
   field-effect transistor means having a main current path connected between said collector and base electrodes of said bipolar power transistor switching means, and a gate electrode connected to said third terminal.

41. The active "snubbing" device of claim 40, wherein said bipolar power transistor switching means consists of a bipolar power transistor having a relatively low current gain for avoiding the latchback phenomena associated with bipolar transistors.

42. The active "snubbing" device of claim 40 or 41, wherein said field-effect transistor means consists of a low power field-effect transistor relative to the total power being "snubbed", having drain and source electrodes connected between the collector and base electrodes of said bipolar power transistor, respectively, said field-effect transistor providing a relatively high-input impedance for said active "snubbing" device, the former being responsive to said control signal for turning on, causing the impedance between its drain and source electrodes to substantially reduce, thereby providing both base current flow in said bipolar transistor, turning on the latter, and a negative feedback current path between the collector and base electrodes of said bipolar transistor for improving the transient power capability of the latter.

43. The active "snubbing" device of claim 42, further including a relative low value resistor connected between the base and emitter electrodes of said bipolar transistor, for ensuring fast turn-off thereof when a zero bias is applied to its base electrode.

44. In combination, a pair of d.c. power supply terminals, a load, a power transistor having a control electrode and a main conducting path, the main conducting path, load and pair of d.c. power supply terminals being connected in series with each other, the impedance of the main conducting path being relatively high and low in response to first and second signal levels respectively applied to the control electrode, semiconductor means having control terminal means and first and second terminals shunting the main conducting path and connected in series with the load, the impedance of the semiconductor means between the first and second terminals being relatively high and low in response to low and high signal amplitudes respectively applied to the control terminal means, the low impedance between the first and second terminals being substantially higher than the low impedance of the main conducting path but much lower than the high impedances, the power consumption of the power transistor while in the low impedance state being much less than the power consumption of the semiconductor means in the low impedance state, the power transistor having a tendency to be damaged in response to the full load voltage and current at the time of transitions between the high and low impedance states of the main conducting path, a first signal source having transitions between the first and second signal levels connected to the control electrode, second signal source means having transitions between the high and low signal amplitudes connected to the control terminal means, the transitions of the first signal source between the first and second levels activating the power transistor between the high and low impedance states thereof occurring while the impedance between the first and second terminals is low in response to the second signal source means maintaining the control terminal means at the high signal amplitude.

45. The combination of claim 44 wherein the semiconductor means includes a first switching element having a first controlled path for selectively supplying current from one of the power supply terminals to the control electrode via the load, and a second switching element series having a second controlled path for supplying current flowing from the one power supply terminal and the load through the first controlled path to a second of the power supply terminals, the control terminal means including separate first and second control electrodes of the first and second switching elements, respectively, the second signal source means including separate additional and further signal sources, each having high and low values, the additional signal source being connected to the first control electrode to activate the first switching device into conducting and non-conducting states in response to the additional signal source respectively having the high and low values, the further signal source being connected to the second control electrode to activate the second switching device into conducting and non-conducting states in response to the further signal source respectively having the high and low values, the first signal source including the additional signal source and the first switching means transitions of the further signal source occurring while the additional signal source has a high value to provide a conducting state for current from the one power supply terminal to the control electrode via the load and the first switching device.

46. The combination of claim 45 wherein the first switching device has a conducting impedance much greater than the conducting impedances of the second switching device and the power transistor.

47. The combination of claim 46 wherein the first and second switching devices are field effect transistors having series connected source drain paths.

48. In combination, a pair of d.c. power supply terminals, a load, a power transistor having a control electrode and a main conducting path, the main conducting path, load and pair of d.c. power supply terminals being connected in series with each other, the impedance of the main conducting path being relatively high and low in response to first and second signal levels respectively applied to the control electrode, semiconductor means having control terminal means and first and second terminals shunting the main conducting path and connected in series with the load, the impedance of the semiconductor means between the first and second terminals being relatively high and low in response to low and high signal amplitudes respectively applied to the control terminal means, the low impedance between the first and second terminals being substantially higher than the low impedance of the main conducting path but much lower than the high impedances, the power consumption of the power transistor while in the low impedance state being much less than the power consumption of the semiconductor means in the low impedance state, the power transistor having a tendency to be damaged in response to the full load voltage and current at the time of transitions between the high and low impedance states of the main conducting path, a first signal source having transitions between the first and second signal levels connected to the control electrode, second signal source means having transitions between the high and low signal amplitudes connected to the control terminal means, the transitions of the first signal source between the first and second levels activating the power transistor between the high and low impedance states thereof occurring while the impedance between the first and second terminals is low in response to the second signal source means maintaining the control terminal means at the high signal amplitude, the transitions of the second signal source occurring while no transitions of the main path impedance are occurring.

49. The combination of claim 44 or 48 wherein the second signal source means includes a single source.

50. The combination of claim 49 wherein the semiconductor means comprises a field effect transistor.

51. The combination of claim 49 wherein the semiconductor means comprises a field effect transistor, and the power transistor is a bipolar transistor having base, emitter and collector electrodes, the base being the control electrode of the transistor, a resistor connected in shunt between the base and emitter.

52. The combination of claim 44 or 48 wherein the semiconductor means comprises a field effect transistor.

53. The combination of claim 52 wherein the first signal source includes a semiconductor switching device for selectively coupling current to the control electrode from one of the power supply terminals via the load.

54. The combination of claim 52 wherein the first signal source includes a field effect transistor having a source drain path for selectively coupling current to the control electrode from one of the power supply terminals via the load.

55. The combination of claim 52 wherein the first signal source includes a bipolar transistor having an emitter collector path for selectively coupling current to the control electrode from one of the power supply terminals via the load.

56. The combination of claim 52 wherein the first signal source includes a bipolar transistor having an emitter collector path shunted by a field effect transistor source drain path for selectively coupling current to the control electrode from one of the power supply terminals via the load.

57. The combination of claim 44 or 48 wherein the semiconductor means comprises a field effect transistor and the power transistor is a bipolar transistor having base, emitter and collector electrodes, the base being the control electrode of the transistor, further including a resistor connected in shunt between the base and emitter.

58. The combination of claim 50 wheren the first signal source includes a semiconductor switching device for selectively coupling current to the control electrode from one of the power supply terminals via the load.

59. The combination of claim 50 wherein the first signal source includes a field effect transistor having a source drain path for selectively coupling current to the control electrode from one of the power supply terminals via the load.

60. The combination of claim 50 wherein the first signal source includes a bipolar transistor having an emitter collector path for selectively coupling current to the control electrode from one of the power supply terminals via the load.

61. The combination of claim 50 wherein the first signal source includes a bipolar transistor having an emitter collector path shunted by a field effect transistor source drain path for selectively coupling current to the control electrode from one of the power supply terminals via the load.

62. The combination of claim 44 or 48 wherein the second signal source includes a bipolar transistor having a base electrode and an emitter collector path connected to be responsive to current from one of the power supply terminals as coupled through the load, and a semiconductor switching device connected between the collector and base electrodes for the selectively supplying current from the one power supply terminal as coupled through the load to the base.

63. The combination of claim 44 or 48 wherein the second signal source includes a bipolar transistor having a base electrode and an emitter collector path connected to be responsive to current from one of the power supply terminals as coupled through the load, and a field effect transistor having a source drain path connected between the collector and base electrodes for selectively supplying current from the one power supply terminal as coupled through the load to the base.

64. The combination of claim 44 or 48 wherein the means shunting the path includes a bipolar transistor having a base electrode and an emitter collector path connected to be responsive to current from one of the power supply terminals as coupled through the load, and a semiconductor switching device connected between the collector and base electrode for selectively supplying current from the one power supply terminal as coupled through the load to the base.

65. The combination of claim 44 or 48 wherein the means shunting the path includes a bipolar transistor having a base electrode and an emitter collector path connected to be responsive to current from one of the power supply terminals as coupled through the load, and a field effect transistor having a source drain path connected between the collector and base electrodes for selectively supplying current from the one power supply terminal as coupled through the load to the base.

* * * * *